(12) United States Patent
Yamada

(10) Patent No.: US 8,294,639 B2
(45) Date of Patent: Oct. 23, 2012

(54) DISPLAY UNIT

(75) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 162 days.

(21) Appl. No.: 12/970,102

(22) Filed: Dec. 16, 2010

(65) Prior Publication Data

US 2011/0156991 A1    Jun. 30, 2011

(30) Foreign Application Priority Data

Dec. 25, 2009   (JP) ................... 2009-294872

(51) Int. Cl.
*G09G 3/30* (2006.01)

(52) U.S. Cl. ............... 345/76; 345/45; 345/46; 345/82; 313/112; 313/498; 313/503; 313/506

(58) Field of Classification Search .............. 345/44–46, 345/76–83, 204; 313/112–113, 498–512; 257/13, 98, E33.067, E33.073, E33.074
See application file for complete search history.

(56) References Cited

U.S. PATENT DOCUMENTS

| | | | |
|---|---|---|---|
| 6,476,550 B1 | 11/2002 | Oda et al. | |
| 6,505,901 B1 * | 1/2003 | Fukuda | 313/504 |
| 7,619,357 B2 | 11/2009 | Onishi et al. | |
| 7,868,528 B2 * | 1/2011 | Kobayashi | 313/112 |
| 2002/0180348 A1 | 12/2002 | Oda et al. | |
| 2005/0077820 A1 | 4/2005 | Onishi et al. | |
| 2007/0069996 A1 * | 3/2007 | Kuba et al. | 345/76 |
| 2008/0024402 A1 * | 1/2008 | Nishikawa et al. | 345/82 |
| 2009/0021151 A1 * | 1/2009 | Fukuda | 313/504 |

FOREIGN PATENT DOCUMENTS

| | | |
|---|---|---|
| JP | 2991183 B2 | 12/1999 |
| JP | 2004349111 A | 12/2004 |
| JP | 2007234254 A | 9/2007 |

* cited by examiner

*Primary Examiner* — Quan-Zhen Wang
*Assistant Examiner* — Jennifer Nguyen
(74) *Attorney, Agent, or Firm* — Fitzpatrick, Cella, Harper & Scinto

(57) ABSTRACT

A display unit has an interlayer formed at least as one or more than one layers and arranged between a light-emitting layer and a diffractive element. The interlayer has a thickness not less than 500 nm and not more than 2,000 nm and an average refractive index greater than a refractive index of the light-emitting layer. The optical path length of the interlayer defined as a product of multiplication of its average refractive index by its thickness satisfies the requirement shown below:

$$\frac{(m+0.1)}{2 \cdot \sqrt{1-\left(\frac{n_L}{n_m}\right)^2}} \leq n_m d \leq \frac{(m+0.6) \cdot \lambda_0}{2 \cdot \sqrt{1-\left(\frac{n_L}{n_m}\right)^2}}$$

where m is an integer not less than 0; $\lambda_0$ is a wavelength in vacuum; $n_m$ is the average refractive index of the interlayer; d is the thickness of the interlayer; and $n_L$ is the refractive index of the light-emitting layer.

6 Claims, 8 Drawing Sheets

DISPLAY UNIT

BACKGROUND OF THE INVENTION

1. Field of the Invention

The present invention relates to a display unit. More particularly, this invention relates to a display unit showing an improved light extraction efficiency and realized by using diffractive elements.

2. Description of the Related Art

There has been remarkable progress in developing a spontaneous light emission type display unit using a fluorescent substance such as electron-emitting device type displays, organic EL displays and LED displays in recent years.

Electron-emitting device type displays are designed to use electrons emitted from an electron source as excitation source, excite a light-emitting layer typically made of a fluorescent substance to emit light and extract the emitted light to the outside. Organic EL displays and LED displays are designed to inject an electric current into a light-emitting layer as excitation source, make the light-emitting layer emit light and extract the emitted light to the outside. With any of the above arrangements, the light emitted from a light-emitting layer is extracted to the outside by way of a front panel or an electrode.

However, the light-emitting layer, the front panel and the electrode give rise to differences of refractive index at the interfaces thereof and, therefore, the part of the light emitted from the light-emitting layer and showing an emission angle not smaller than the critical angle is subjected to total reflection. Then, that part of the light cannot be extracted to the outside to consequently reduce the light excitation efficiency and lower the brightness of the display unit.

Methods of forming a diffraction grating at the front surface side or at the rear surface side of a light-emitting layer and diffracting the light emitted from the light-emitting layer by means of the diffraction grating in order to efficiently extract light to the outside have been developed as techniques of improving the light extraction efficiency. Japanese Patent Application Laid-Open No. 2004-349111 proposes a structure having an interlayer made of a thin film and arranged between a light-emitting layer and a diffraction grating to raise the light excitation efficiency and allow an electrode to be prepared on a stable basis and the light-emitting layer to emit light excellently.

SUMMARY OF THE INVENTION

However, according to the above-cited Japanese Patent Application Laid-Open No. 2004-349111, the interlayer is made of a thin film and preferably has a thickness not greater than 50 nm. With such a thin film, the interlayer is inevitably affected by the profile of the diffraction grating so as to show an undulated profile if efforts are made to form a uniformly flat interlayer. If the interlayer is undulated and not uniformly flat, it is difficult to form an excellently operating light-emitting layer and the internal quantum efficiency of display unit falls. Additionally, such a display unit gives rise to an uneven brightness because the light extraction efficiency varies from pixel to pixel of the display unit or the display unit shows intra-planar fluctuations of light extraction efficiency.

Therefore, it may be desirable to form an interlayer having a large thickness in order to avoid an undulated profile for the interlayer. On the other hand, when an interlayer having a large thickness is formed, there arises a problem of a reduced light extraction efficiency. Alternatively, a flat interlayer having a large and uniform thickness may be manufactured first and then the thickness may be reduced by way of a CMP process. However, it is difficult to form a large and uniform display surface by way of such a process and additionally, the cost of such a manufacturing process will be high.

In view of the above-identified problems, it is therefore the object of the present invention to provide a display unit having an interlayer arranged between a light-emitting layer and a diffractive element with a thickness that allows the interlayer to be prepared as a uniformly flat film layer, while showing a high light extraction efficiency and, if any, an uneven brightness only to a reduced extent.

According to the present invention, the above object is achieved by providing a display unit including an interlayer formed at least as one or more than one layers and arranged between a light-emitting layer and diffractive elements; the interlayer having a thickness not less than 500 nm and not more than 2,000 nm and an average refractive index greater than a refractive index of the light-emitting layer; an optical path length of the interlayer defined as a product of multiplication of the average refractive index of the interlayer by the thickness of the interlayer satisfying a requirement of the formula shown below:

$$\frac{(m+0.1)\cdot\lambda_0}{2\cdot\sqrt{1-\left(\frac{n_L}{n_m}\right)^2}} \leq n_m d \leq \frac{(m+0.6)\cdot\lambda_0}{2\cdot\sqrt{1-\left(\frac{n_L}{n_m}\right)^2}}$$

where m is an integer not less than 0; $\lambda_0$ is a wavelength in vacuum; $n_m$ is the average refractive index of the interlayer; d is the thickness of the interlayer; and $n_L$ is the refractive index of the light-emitting layer.

Thus, according to the present invention, there is provided a display unit having an interlayer arranged between a light-emitting layer and a diffractive element with a thickness that allows the interlayer to be prepared as a uniformly flat film layer, while showing a high light extraction efficiency and, if any, an uneven brightness only to a reduced extent.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings illustrating the embodiments. Throughout the drawings, the items having the same functional features are denoted by the same reference symbols and will not be described repeatedly.

EMBODIMENTS

Embodiment 1

Figure 1:
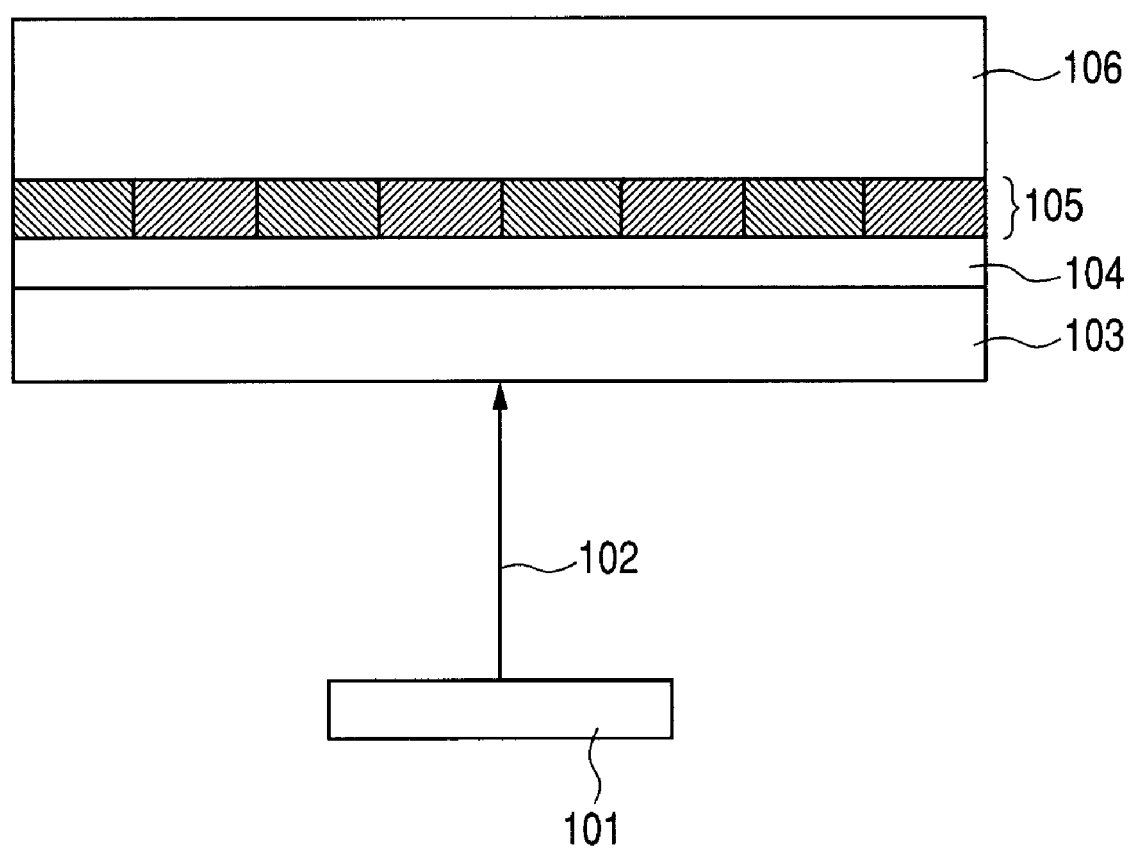
FIG. 1 is a schematic cross-sectional view of the display unit of Embodiment 1 according to the present invention.

The display unit of Embodiment 1 according to the present invention will be described by referring to FIG. 1 illustrating the configuration thereof. FIG. 1 is a cross-sectional view of a single pixel of a field emitter display including a plurality of pixels.

The display unit of this embodiment irradiates a light-emitting layer 103 made of a fluorescent material with electrons 102 emitted from an electron source 101 to emit light of colors that correspond to respective pixels. Part of the emitted light is diffracted by diffraction grating 105 by way of an interlayer 104 and extracted to the outside. The diffraction grating 105 has a structure showing an intra-planar distribution of refractive index.

The interlayer 104 of this embodiment is formed so as to show a thickness of not less than 500 nm. Thus, a uniformly flat film layer can be formed without being affected by the profile of the diffraction grating 105. A uniformly flat interlayer can be formed with ease in the plane of the display screen of pixels when the interlayer 104 is preferably made to show a thickness of about 750 nm. Note that the interlayer may not necessarily be formed as a single layer. In other words, the interlayer may alternatively be formed as one or more than one layers, each of which profile of undulations are reduced for flattening the interlayer. The interlayer 104 can be prepared on a stable basis at low cost when it is formed to show a thickness of not more than 2,000 nm. A wide dispersion of thickness error may arise among the pixels and/or a high raw material consumption rate, or throughput degradation, may result in cost increase when the interlayer 104 is prepared to show a thickness of not less than 2,000 nm. Preferably, the interlayer 104 is formed to show a thickness of not more than 1,500 nm.

Then, the light extraction efficiency η satisfies the requirement of formula (1) shown below:

$$\eta = \eta_0 + \Delta\eta \cdot \sin(\alpha) \quad (1)$$

where α is the phase difference of reflected light in the interlayer and $\eta_0$ and $\Delta\eta$ are respectively the average light extraction efficiency and the variance of light extraction efficiency. The values $\eta_0$ and $\Delta\eta$ can be changed as a function of the refractive index of the light-emitting layer 103 and that of the diffraction grating 105. The light extraction efficiency η refers to the ratio of the light extracted to the outside (into the air) of the front panel 106 relative to the light isotropically emitted from the light-emitting layer 103.

Figure 2:
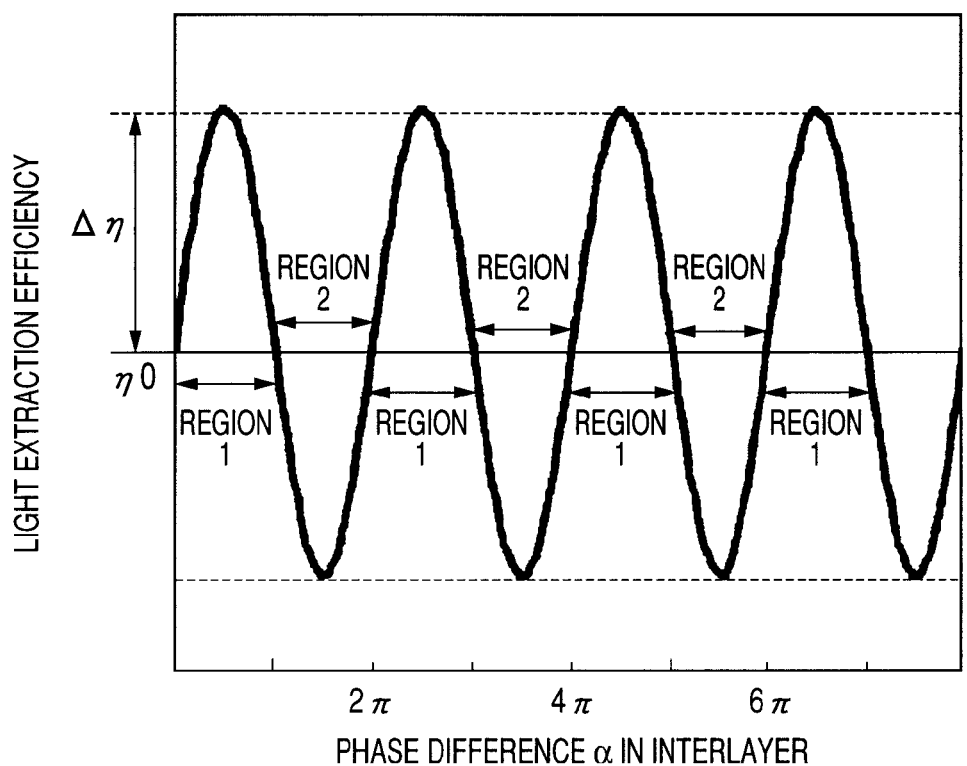
FIG. 2 is a graph illustrating the relationship between the normalized optical path length and the light extraction efficiency of Embodiment 1 according to the present invention.

FIG. 2 illustrates the relationship between the phase difference α of reflected light and the light extraction efficiency of the interlayer.

Figure 3A:
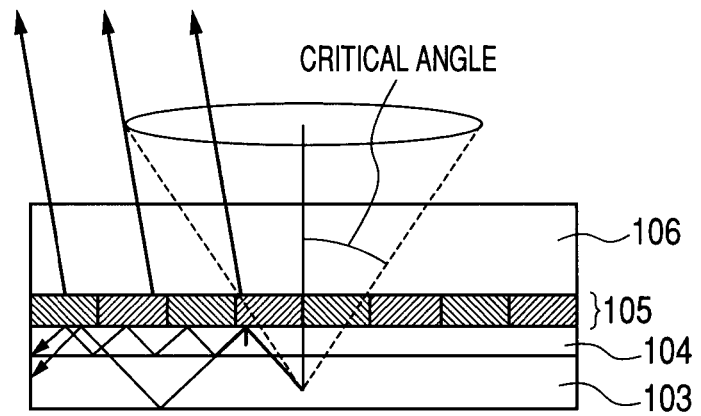
FIGS. 3A, 3B and 3C are schematic cross-sectional views of the display unit of Embodiment 1 according to the present invention.

Now, the principle underlying the periodic change of the light extraction efficiency as a function of the phase difference α of reflected light in the interlayer will be described below by referring to FIGS. 3A to 3C.

As an interlayer 104 is formed between the light-emitting layer 103 and the diffraction grating 105, light emitted from the light-emitting layer at an angle greater than the critical angle is subjected to multiple reflection at the interfaces of the interlayer or those of the light-emitting layer and confined to the inside of the interlayer or that of the light-emitting layer. Part of the confined light is coupled to the diffraction grating and extracted to the outside as the confined light propagates through the interlayer or the light-emitting layer (FIG. 3A).

Figure 3B:
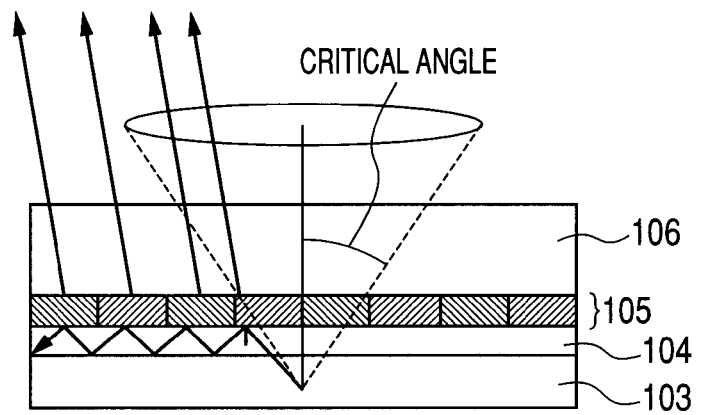

When the phases of the components of light that are subjected to multiple reflection at the interfaces of the interlayer agree with each other to raise the intensity of light (α=(4m+1)π/2, where m is an integer not less than 0), the confinement of light emitted from the light-emitting layer to the inside of the interlayer is intensified (FIG. 3B). The light confined to the inside of the interlayer is hardly lost so that the coupling efficiency with the diffraction grating rises. As a result, the light extraction efficiency rises (region 1 in FIG. 2).

Figure 3C:
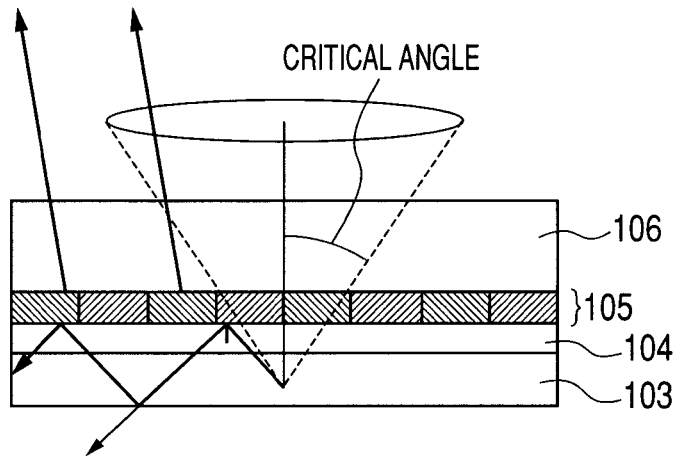

On the other hand, when the phases of the components of light that are subjected to multiple reflection at the interfaces of the interlayer counter each other to reduce the intensity of light, the confinement of light to the inside of the interlayer is weakened and the light emitted from the light-emitting layer is mainly confined to the inside of the light-emitting layer (FIG. 3C). The light confined to the inside of the light-emitting layer is reabsorbed by the fluorescent material in the light-emitting layer, is emitted from the rear surface thereof and/or gets to and is absorbed by the absorbent material at the ends of the pixels. Thus, part of the emitted light is lost to reduce the light extraction efficiency (region 2 in FIG. 2).

For these reasons, the light extraction efficiency changes periodically as a function of the phase difference of reflected light in the interlayer.

The phase difference α of reflected light is expressed by formula (2) shown below:

$$\alpha = 4\pi \frac{n_m d \cos\theta_m}{\lambda_0} - 0.2\pi \quad (2)$$

where $n_m$ is the average refractive index of the interlayer, d is the thickness of the interlayer, $\lambda_0$ is the wavelength in vacuum. The average refractive index of the interlayer is defined to be the value of the quotient of division of the optical path length of the interlayer divided by the total thickness of the interlayer. In other words, the value of the product of multiplication of the average refractive index of the interlayer multiplied by the thickness of the interlayer is the optical path length of the interlayer. $\theta_m$ is the angle of light propagating through the interlayer, which satisfies the requirement of formula (3) shown below due to the Snell's law.

$$\theta_m = \arcsin\left(\frac{n_L}{n_m}\sin\theta_L\right) \cong \arcsin\left(\frac{n_L}{n_m}\right) \quad (3)$$

where $n_L$ is the refractive index of the light-emitting layer and $\theta_L$ is the angle of light propagating through the light-emitting layer, which is between 80° and 90°. Thus, light of an angle between 80° and 90° contributes to the light extraction efficiency. This is because the quantity of light emitted from the light-emitting layer is increased as the angle $\theta_L$ increases. The initial phase (0.2π) is defined as a result of coupling of the evanescent waves generated in the interlayer to the diffraction grating and the penetration depth of the evanescent waves.

As described above, it will be seen from the above formulas (1), (2) and (3) that the light extraction efficiency varies as a function of the optical path length of the interlayer and that the light extraction efficiency is further raised in the region 1 in FIG. 2 or when the requirement of formula (4) shown below is satisfied:

$$\frac{(m+0.1)\cdot\lambda_0}{2\cdot\sqrt{1-\left(\frac{n_L}{n_m}\right)^2}} \leq n_m d \leq \frac{(m+0.6)\cdot\lambda_0}{2\cdot\sqrt{1-\left(\frac{n_L}{n_m}\right)^2}} \quad (4)$$

(m: an integer not less than 0)

On the other hand, the light extraction efficiency falls when the requirement of the formula (4) is not satisfied (region 2 in FIG. 2).

From the above, it will be seen that a high light extraction efficiency can be obtained when the requirement of the formula (4) is satisfied if the interlayer is formed with a thickness of not less than 500 nm and not more than 2,000 nm. As a result, it is possible to obtain a display unit showing a high light extraction efficiency and if any, an uneven brightness only to a reduced extent.

Now, an example of numerical values of this embodiment will be described below.

The light-emitting layer 103 is formed as a layer containing a fluorescent material that shows a refractive index of 1.7 and emits light with a central wavelength of 550 nm. The diffraction grating 105 is formed by means of $Al_2O_3$ showing a refractive index of 1.8 to a thickness of 950 nm with holes of a diameter of 1,450 nm arranged at a cycle period of 2,300 nm to produce a triangular grating. The interlayer 104 is formed by two layers including a transparent electrode and a dielectric layer. The transparent electrode is made of ITO showing a refractive index of 1.8 and the dielectric layer is made of $Al_2O_3$ showing a refractive index of 1.8.

Figure 4:
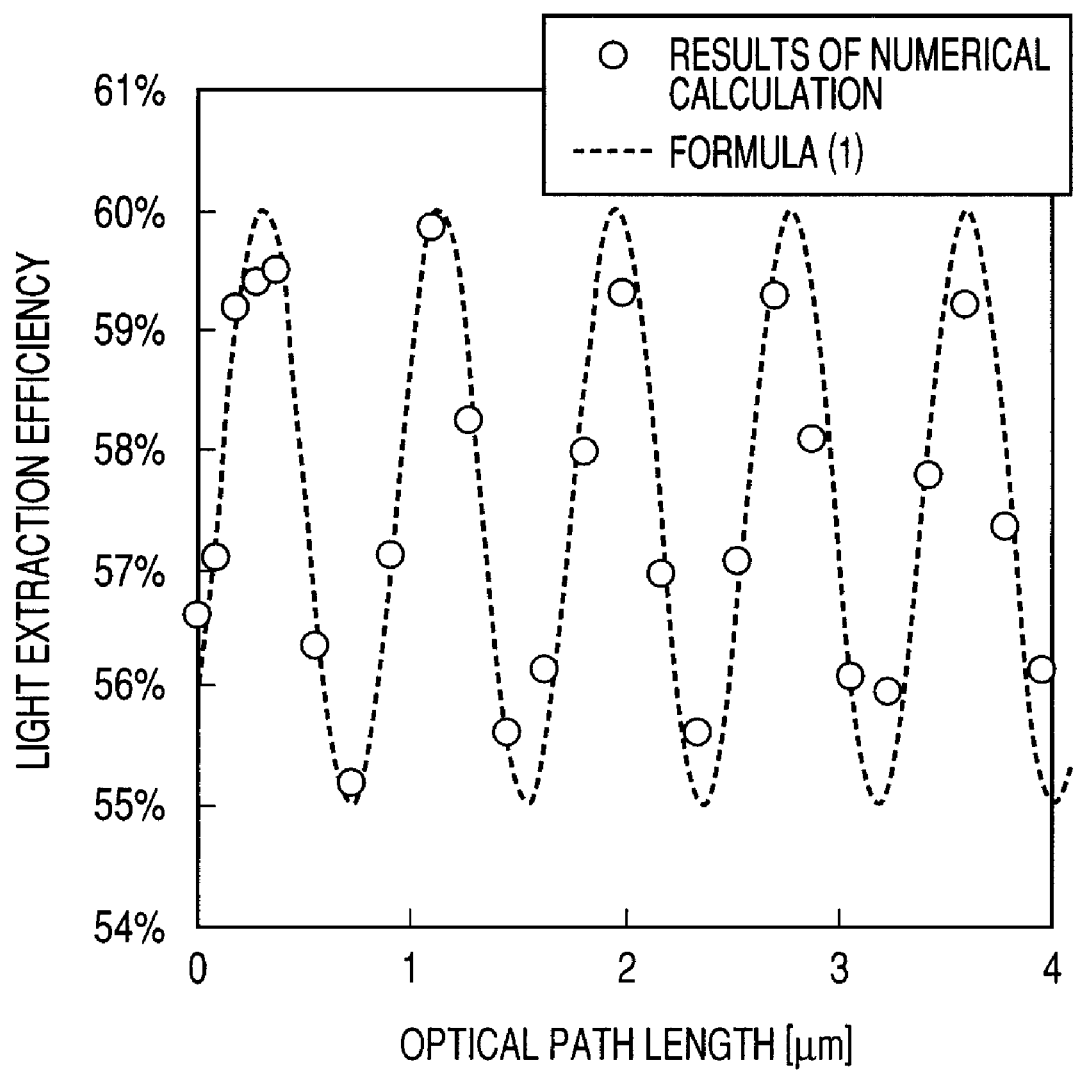
FIG. 4 is a graph illustrating the relationship between the optical path length and the light extraction efficiency of Embodiment 1 according to the present invention.

FIG. 4 shows the relationship between the optical path length and the light extraction efficiency when the optical path length of the interlayer 104 is made to vary. In FIG. 4, the small circles indicate the values obtained by numerical calculations for tracing rays of light and the dotted line indicates the values obtained from the formula (1) ($\eta_0$=57.5, $\Delta\eta$=2.5). FIG. 4 shows an example where the numerical calculations agree with the formula (1) and a high light extraction efficiency is obtained with the range defined by the formula (4).

When the transparent electrode and the dielectric layer are made to have respective thicknesses of 300 nm and 800 nm (the optical path length of the interlayer being 1,980 nm), the light extraction efficiency will be 59.3%. Thus, the light extraction efficiency is higher than the average value of light extraction efficiency ($\eta_0$=57.5%) and also higher than the value when no interlayer is inserted (56.6%). Additionally, the interlayer can be prepared as a uniformly flat film by way of an ordinary lamination process because the interlayer is formed with a thickness of 1,100 nm. Thus, it is possible to obtain a display unit showing a high light extraction efficiency and, if any, an uneven brightness only to a reduced extent.

While the average refractive index of the interlayer 104 is made larger than the effective refractive index of the diffraction grating 105 in this embodiment, the average refractive index may not necessarily be larger than the effective refractive index of the diffraction grating. However, the light emitted from the light-emitting layer is firmly confined to the inside of the interlayer when the average refractive index of the interlayer is larger than the effective refractive index of the diffraction grating. The light confined to the inside of the interlayer is hardly lost so that the coupling efficiency with the diffraction grating rises. Therefore, the average refractive index of the interlayer is preferably larger than the effective refractive index of the diffraction grating.

While 2 is selected for the value of the positive integer m in the formula (4) in this embodiment, the integer m may not necessarily be 2 or greater than 2, and 0 or 1 may alternatively be selected for the integer m to raise the light extraction efficiency. However, the optical path length of the interlayer will be twice or thrice of or greater than the wavelength of light when 2 or more is selected for the positive integer m. Then, the light confined to the inside of the interlayer can propagate satisfactorily through the interlayer so that such a value is desirable to extract uniform light in the plane of the pixels.

While the interlayer 104 of this embodiment includes an electrode made of ITO, the interlayer may not necessarily require an electrode layer and alternatively an electrode may be formed between the front panel and the diffraction grating or the diffraction grating may be formed by means of an electrode. However, an electrode is preferably formed near the light-emitting layer because then the internal quantum efficiency of the light-emitting layer will be improved.

A dielectric layer made of $Al_2O_3$ is formed to a thickness of 800 nm in the interlayer 104 at the side of the diffraction grating 105. A uniformly flat film can be prepared only by using a dielectric layer when the dielectric layer is made to have a thickness not less than 500 nm and not more than 2,000 nm. Then, an easy process can be used to prepare the interlayer at low cost.

While the interlayer is formed by means of $Al_2O_3$ and ITO that are inorganic materials, the interlayer may not necessarily be formed by means of inorganic materials and may alternatively be formed by means of organic materials. However, the interlayer is preferably formed by means of inorganic materials because then the interlayer will be highly resistive against the heat generated in the light-emitting layer and also highly durable.

Now, another example of numerical values of this embodiment will be described below. Only the thickness of the dielectric layer and the light emission wavelength of the light-emitting layer 103 of this example are differentiated from their counterparts of the above example.

Figure 5A:
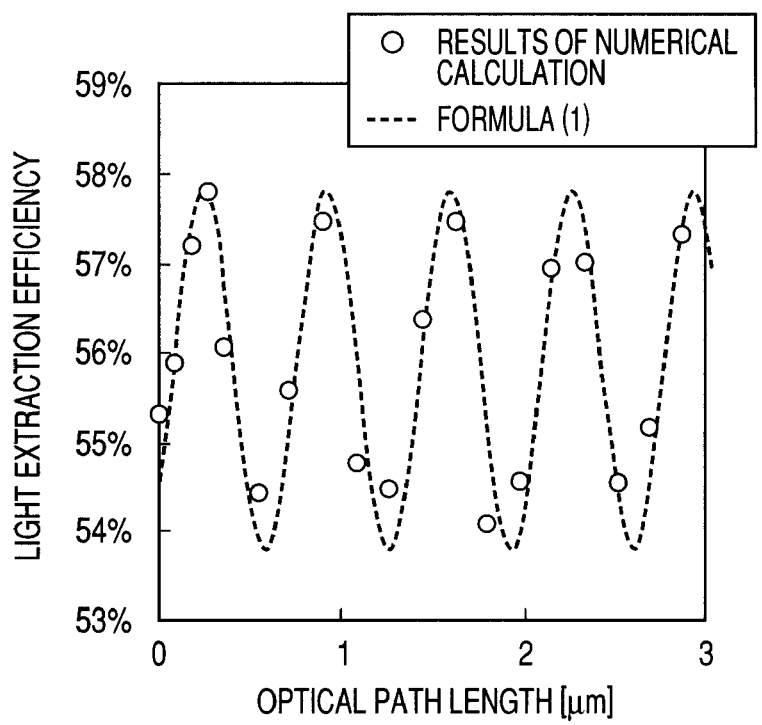
FIGS. 5A and 5B are graphs illustrating the relationship between the optical path length and the light extraction efficiency of Embodiment 1 according to the present invention.
Figure 5B:
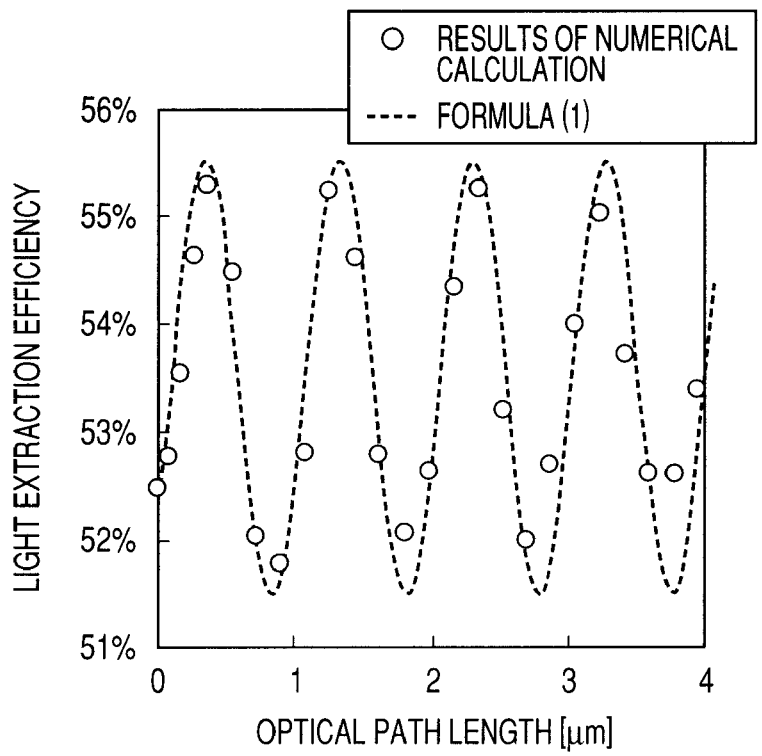

FIGS. 5A and 5B show the optical path length and the light extraction efficiency of the interlayer when the wavelength of light emitted from the light-emitting layer is 450 nm and 650 nm respectively. Then, the light extraction efficiency will be 57.5% and 55.3% to achieve a high light extraction efficiency for the pixels when the thickness of the dielectric layer is made equal to 600 nm and 950 nm respectively.

Embodiment 2

Figure 6:
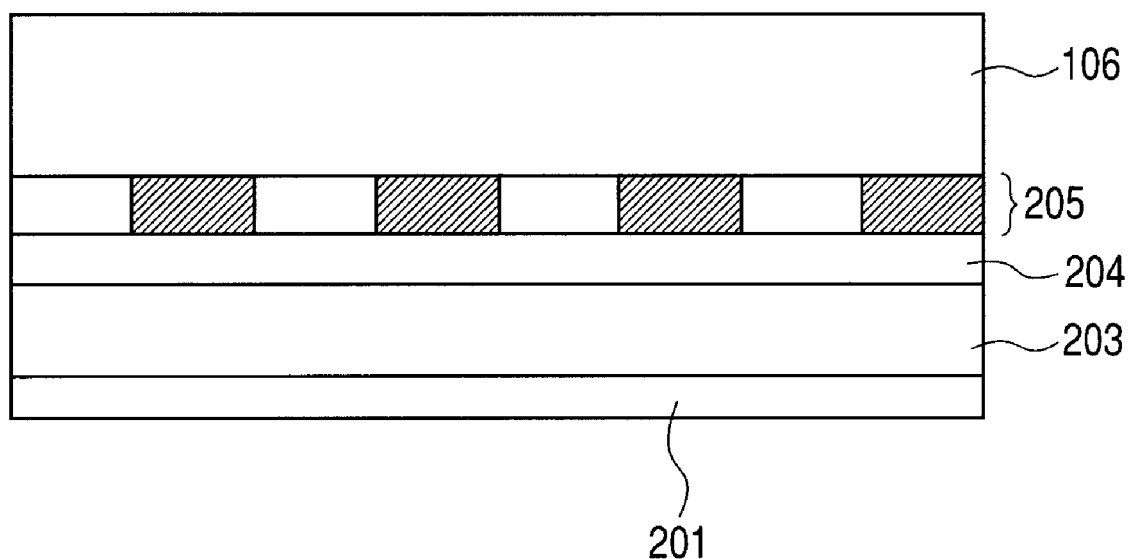
FIG. 6 is a schematic cross-sectional view of the display unit of Embodiment 2 according to the present invention.

The display unit of Embodiment 2 according to the present invention will now be described below by referring to FIG. 6. FIG. 6 is a schematic cross-sectional view of a single pixel of an organic EL display including a plurality of pixels.

A potential difference (voltage) is applied to and an electric current is injected into electrode 201 and transparent electrode 204 of the display unit of this embodiment to excite light-emitting layer 203 and emit light of colors that correspond to respective pixels. Part of the emitted light is diffracted by diffractive element 205 by way of the transparent electrode 204 that operates as an interlayer and extracted to the outside. The diffractive element 205 may be a periodic diffraction grating, a photonic quasi-crystal that shows a high degree of symmetry, micro-particles arranged non-periodically or some other appropriate diffractive element.

Then, a high light confinement efficiency can be achieved when the light emission wavelength of the light-emitting layer 203 is 550 nm and the thickness of the transparent electrode 204 is 600 nm. Similarly, a high light extraction efficiency can be achieved when the light emission wavelength of the light-emitting layer 203 is 450 nm or 650 nm and the thickness of the transparent electrode 204 is 500 nm or 700 nm, whichever is appropriate. With any of the above described arrangements, it is possible to obtain a display unit showing a high light extraction efficiency and, if any, an uneven brightness only to a reduced extent.

Embodiment 3

The manufacturing process of Embodiment 1 or Embodiment 2 will now be described below as Embodiment 3 by referring to FIGS. 7A through 7H.

Figure 7A:
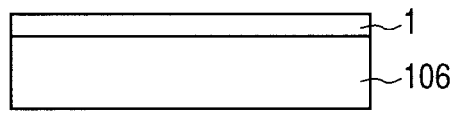
FIGS. 7A, 7B, 7C, 7D, 7E, 7F, 7G and 7H are a schematic illustration of the process of manufacturing the display unit of Embodiment 3 according to the present invention.
Figure 7B:
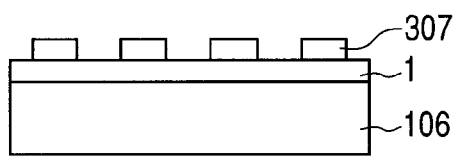

In the manufacturing process of this embodiment, firstly, material 1 is laid on glass substrate (front panel) 106 in order to form a diffractive element 305 (FIG. 7A). Then, a resist film is formed by means of evaporation or sputtering and exposed to light at predetermined positions thereof to by turn form a resist mask 307 (FIG. 7B).

Figure 7C:
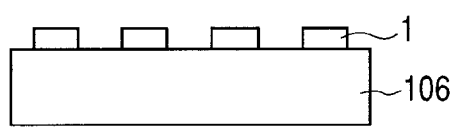
Figure 7D:
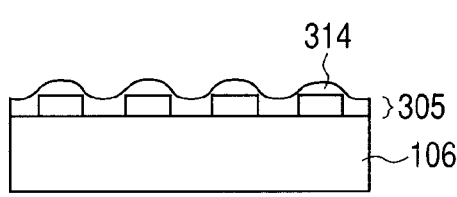

Subsequently, the material 1 is etched to a predetermined depth by means of an etching process such as RIE and the resist mask 307 is removed typically by means of asking (FIG. 7C). Thereafter, material 2 that is typically a dielectric is buried in the holes formed in the material 1 by means of sputtering or evaporation that shows a good linearity (FIG. 7D).

Figure 7E:
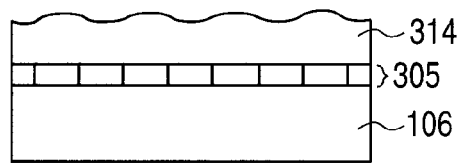
Figure 7F:
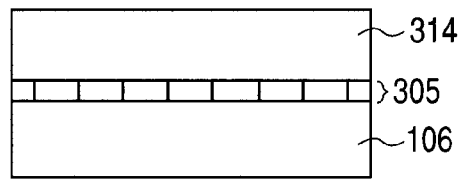

At this time, layer 314 is affected by the profile of the diffractive element 305 and becomes an undulated profile. Thereafter, a film having a relatively large thickness is formed and laid in order to produce a uniform layer 324 (FIG. 7E). As the thickness is increased, the undulated profile becomes mild. Then, a layer 324 of a substantially flat film can be produced when the thickness is made to exceed about 500 nm (FIG. 7F).

Figure 7G:
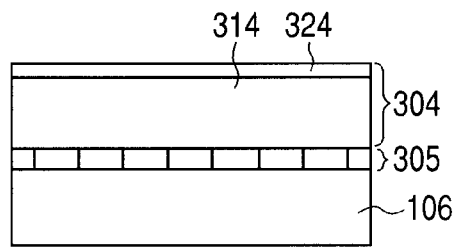
Figure 7H:
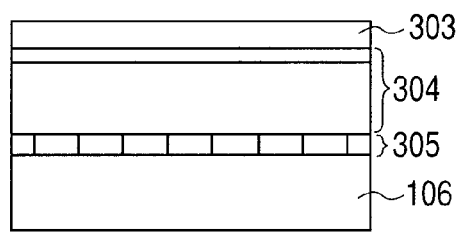

Subsequently, interlayer 304 is formed, if necessary, with an electrode 314 of ITO or the like material that is to be prepared by means of evaporation or sputtering (FIG. 7G). Then, light-emitting layer 303 is formed (FIG. 7H) and, if necessary, an electrode or a rear panel is prepared to obtain a display unit.

Figure 8A:
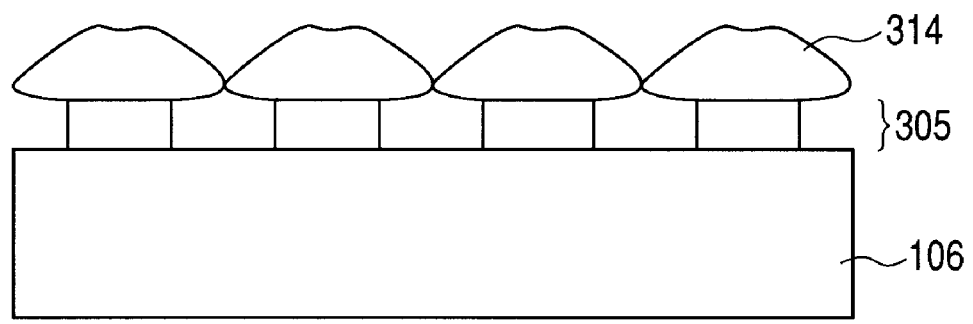
FIGS. 8A, 8B and 8C are a schematic illustration of the process of manufacturing the display unit of Embodiment 3 according to the present invention.
Figure 8B:
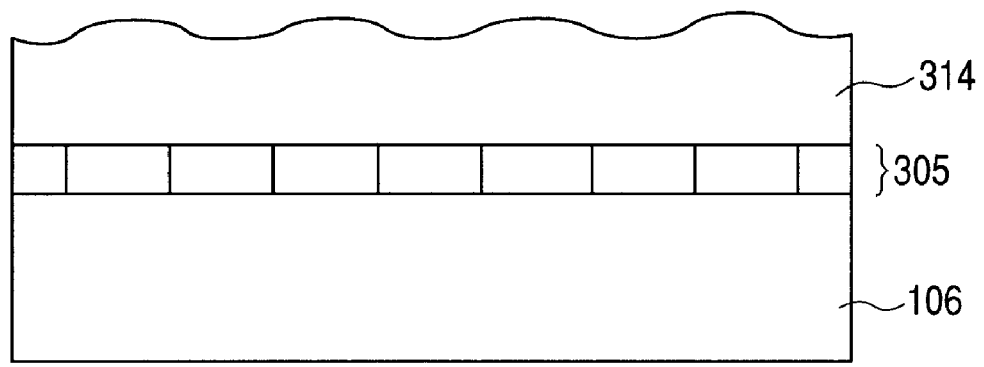
Figure 8C:
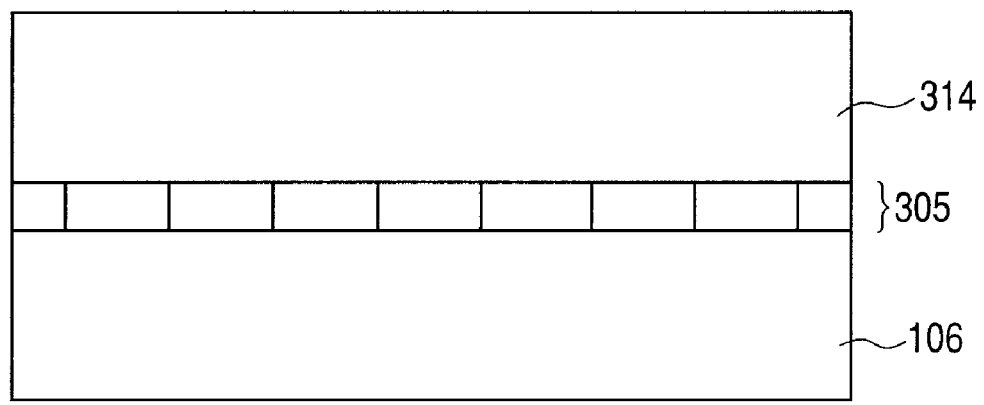

Now, an instance where diffractive element 305 formed as a layer including holes will be described below by referring to FIGS. 8A through 8C.

When the holes formed in the material 1 are not buried with some other material but air is left therein, material 3 is laid to form layer 314 by means of evaporation or sputtering that shows only a poor linearity. When the layer 314 is thin, layer 324 is affected by the profile of the diffraction grating to show an undulated profile (FIG. 8A). However, as the thickness of the layer 314 is increased, the undulated profile becomes mild (FIG. 8B) and eventually turns out to be flat (FIG. 8C). Subsequently, a process similar to the above-described one is followed to obtain a display unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-294872, filed Dec. 25, 2009, which is hereby incorporated by reference herein in its entirety.

What is claimed is:

1. A display unit comprising an interlayer formed at least as one or more than one layers and arranged between a light-emitting layer and a diffractive element;
the interlayer having a thickness not less than 500 nm and not more than 2,000 nm and an average refractive index greater than a refractive index of the light-emitting layer;
an optical path length of the interlayer defined as a product of multiplication of the average refractive index of the interlayer by the thickness of the interlayer satisfying a requirement of the formula shown below:

$$\frac{(m+0.1) \cdot \lambda_0}{2 \cdot \sqrt{1 - \left(\frac{n_L}{n_m}\right)^2}} \leq n_m d \leq \frac{(m+0.6) \cdot \lambda_0}{2 \cdot \sqrt{1 - \left(\frac{n_L}{n_m}\right)^2}}$$

where m is an integer not less than 0; $\lambda_0$ is a wavelength in vacuum; $n_m$ is the average refractive index of the interlayer; d is the thickness of the interlayer; and $n_L$ is the refractive index of the light-emitting layer.

2. The display unit according to claim 1, wherein the average refractive index of the interlayer is larger than an effective refractive index of the diffractive element.

3. The display unit according to claim 1, wherein the integer m is a positive integer not less than 2.

4. The display unit according to claim 1, wherein the interlayer has a layer including an electrode.

5. The display unit according to claim 1, wherein the interlayer has a dielectric layer at a side of the diffractive element and the dielectric layer has a thickness of not less than 500 nm.

6. The display unit according to claim 1, wherein the interlayer is made of an inorganic material.

* * * * *